(12) United States Patent
Kitazaki

(10) Patent No.: US 6,870,383 B2
(45) Date of Patent: Mar. 22, 2005

(54) SEMICONDUCTOR DEVICE WITH HIGH SPEED SWITCHING OF TEST MODES

(75) Inventor: Kazuhiro Kitazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 10/201,002

(22) Filed: Jul. 24, 2002

(65) Prior Publication Data

US 2003/0075716 A1 Apr. 24, 2003

(30) Foreign Application Priority Data

Oct. 18, 2001 (JP) ........................................ 2001-320908

(51) Int. Cl.⁷ ............................................. G01R 31/28
(52) U.S. Cl. ..................... 324/763; 324/765; 365/201
(58) Field of Search ................................ 324/763, 765; 365/201; 714/724, 733, 734

(56) References Cited

U.S. PATENT DOCUMENTS

| | | | | |
|---|---|---|---|---|
| 4,357,703 A | * | 11/1982 | Van Brunt | ................. 714/733 |
| 4,743,841 A | * | 5/1988 | Takeuchi | ..................... 324/763 |
| 5,526,364 A | * | 6/1996 | Roohparvar | ................ 714/724 |
| 5,596,537 A | * | 1/1997 | Sukegawa et al. | ........... 365/201 |
| 5,627,478 A | * | 5/1997 | Habersetzer et al. | ........ 324/763 |
| 5,651,011 A | * | 7/1997 | Keeth | .......................... 714/724 |
| 5,727,001 A | * | 3/1998 | Loughmiller | ................ 714/745 |

* cited by examiner

Primary Examiner—Ernest Karlsen
(74) Attorney, Agent, or Firm—Arent Fox PLLC

(57) ABSTRACT

A semiconductor device includes a first terminal which receives a signal within a predetermined potential range in a first operation mode, and receives a potential higher above the predetermined potential range in a second operation mode, a high potential detection circuit which is connected to the first terminal, and detects the high potential to generate a high potential detection signal, a second terminal which receives a command signal, a latch circuit which latches the command signal supplied to the second terminal in response to the high potential detection signal, and a third terminal which resets the latch circuit in response to a signal within the predetermined potential range supplied from an exterior of the device.

8 Claims, 7 Drawing Sheets

SEMICONDUCTOR DEVICE WITH HIGH SPEED SWITCHING OF TEST MODES

BACKGROUND OF THE INVENTION

1. Field of the Invention

The present invention generally relates to semiconductor devices equipped with a test function, and particularly relates to a semiconductor device which receives a high potential signal at an external pin thereof that triggers a test mode.

2. Description of the Related Art

Manufactures of semiconductor devices need to check manufactured semiconductor devices before shipping them out in order to insure proper operations. To this end, semiconductor devices are provided with a special function for test purposes. In order to prevent users having purchased semiconductor devices from using a test mode, however, the detail of the test mode is generally not provided to the users. Further, the setting of a test mode is specially designed so as not to let users from accidentally engaging in the test mode.

For example, a test mode is selected by applying high potential signals to a plurality of external pins where such high potential signals are normally not used. Alternatively, a test mode is engaged by entering a test command.

Semiconductor devices of today have highly complex functions, and the number of test modes has been on the increase. The number of external pins to which high potential can be applied is limited, and, also, there is a limit to the number of test modes that can be represented by the combination of these high potential signals. Because of this, there are cases more often than not in which command inputs are used to select a test mode. In order to prevent users from accidentally engaging in a test mode, however, it is desirable to require the application of a high potential to a particular node as a prerequisite for entering into a test node even when command inputs are used.

FIG. 1 is a block diagram of a related-art control circuitry for controlling test modes.

In this example, a high potential VHH is applied to a R/B terminal 11. With this high potential, a command is entered through I/O(0)–I/O(n) terminals 14 while a /WE terminal 12 is kept at the LOW level. This selects a desired test mode.

The I/O terminals 14 shown as I/O(0)–I/O(n) are input/output pins for exchanging data with an exterior of the device, and are connected to an input/output buffer 25. Output signals IN(0)–IN(n) of this input/output buffer are supplied to a test command decoder 31. When data is to be entered from the exterior, the I/O terminals 14 need to be set in a signal-input state. Setting of the state of the I/O terminals 14 is made by controlling a /OE terminal 13 that is used to indicate an output-enable state. In detail, the /OE terminal 13 is set to LOW to place the I/O terminals 14 in the signal input state. The /OE terminal 13 is connected to an input buffer 24, which produces an output signal OE that is supplied to the input/output buffer 25 associated with the I/O terminals 14, thereby controlling the setting of states of the I/O terminals 14.

The /WE terminal 12 is a control pin that controls a command input. A command specified at the I/O terminals 14 is received during the period of /WE being LOW, and is latched at the time /WE changes to HIGH. The /WE terminal 12 is connected to an input buffer 23, which produces an output signal WEB, which is supplied to the test command decoder 31.

The R/B terminal 11 is an output pin for outputting a ready/busy signal indicative of whether the device is operating or not. The R/B terminal 11 outputs LOW during an operation, and outputs HIGH during a standby state. The LOW level is 0 V, and the HIGH level is equal to VCC that is a power supply potential of the device. The R/B terminal 11 is connected to a high potential detection circuit 22 in addition to an output buffer 21. When the high potential VHH is applied to the R/B terminal 11, the high potential detection circuit 22 produces an output signal RBH that is HIGH. This output signal RBH is supplied to the test command decoder 31.

The test command decoder 31 receives the signals RBH, WEB, and IN(0)–IN(n). The signal RBH sets a latch circuit in a latch-ready condition where the latch circuit is provided in the test command decoder 31. The signals IN(0)–IN(n) are stored in the latch circuit, and indicate a test mode through a particular combination thereof. The signal WEB opens a signal path through which the signals IN(0)–IN(n) are supplied to the latch circuit.

FIG. 2 is a timing chart showing the timing at which a high potential is applied and a test mode is set.

With reference to FIG. 1 and FIG. 2, the high potential VHH is applied to the R/B terminal 11, thereby turning the signal RBH to HIGH that is supplied to the test command decoder 31. In response, the latch circuit inside the test command decoder 31 is placed in a condition to be ready to latch. Further, the /OE terminal 13 is changed to LOW, and, at the same time, command signals are supplied to the I/O terminals 14, thereby supplying signals IN(0)–IN(n) indicative of a particular command to the test command decoder 31. While this is done, the /WE terminal 12 is set to LOW, thereby turning the signal WEB to HIGH that is supplied to the test command decoder 31. In response, a signal path through which the signals IN(0)–IN(n) are supplied to the latch circuit is opened in the test command decoder 31, resulting in the signals IN(0)–IN(n) being latched by the latch circuit.

The combination of the latched signals IN(0)–IN(n) in the latch circuit determines a test mode that is selected from a plurality of test modes. If five input/output terminals are used, for example, 32 different combinations can be specified in principle. Since the particular combination of the signals IN(0)–IN(n) that is comprised of all LOW inputs generates latch outputs that are the same as those of a normal and routine mode other than a test mode, the 31 remaining combinations are used to represent test modes.

In the configuration as described above that determines a test mode by use of both a command input and a high potential input, a change from one test mode to another test mode requires resetting of a current test mode. In order to do this, all the latches provided in the test command decoder 31 need to be reset to LOW before a next operation starts.

To this end, the R/B terminal 11 to which a high potential has been being applied is returned to the normal voltage VCC as shown in FIG. 2, thereby setting the signal RBH to LOW. This makes the latch circuit unable to latch, thereby resetting it. Thereafter, the high potential VHH is applied to the R/B terminal 11, and a test command is entered, thereby carrying out an operation that switches from the normal mode to a test mode.

In general, changes of signal potentials can be made in an order of nanoseconds if the signal potentials are around normal potentials. In order to avoid malfunction and/or device destruction caused by overshooting, however, changes of signal potentials are made by taking time in an order of milliseconds if the signal potentials are at high potentials. Because of this, it takes time to switch test modes, resulting in a lengthy test time.

Accordingly, there is a need for a semiconductor device which can complete the switching of test modes in a short period of time.

SUMMARY OF THE INVENTION

It is a general object of the present invention to provide a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor device according to the present invention includes a first terminal which receives a signal within a predetermined potential range in a first operation mode, and receives a potential higher above the predetermined potential range in a second operation mode, a high potential detection circuit which is connected to the first terminal, and detects the high potential to generate a high potential detection signal, a second terminal which receives a command signal, a latch circuit which latches the command signal supplied to the second terminal in response to the high potential detection signal, and a third terminal which resets the latch circuit in response to a signal within the predetermined potential range supplied from an exterior of the device.

In the semiconductor device described above, a function is provided that resets the latch circuit when the signal within the predetermined potential range is supplied from the exterior to the third terminal. This function makes it possible to reset a test mode without manipulating the high potential signal, thereby achieving a reduction in the time required for switching of test modes. Changes of signal levels at high potentials require an operation time of an order of milliseconds whereas changes of signal levels around normal potentials require an operation time of an order of nanoseconds. A significant reduction in the time required for switching of test modes can thus be achieved.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
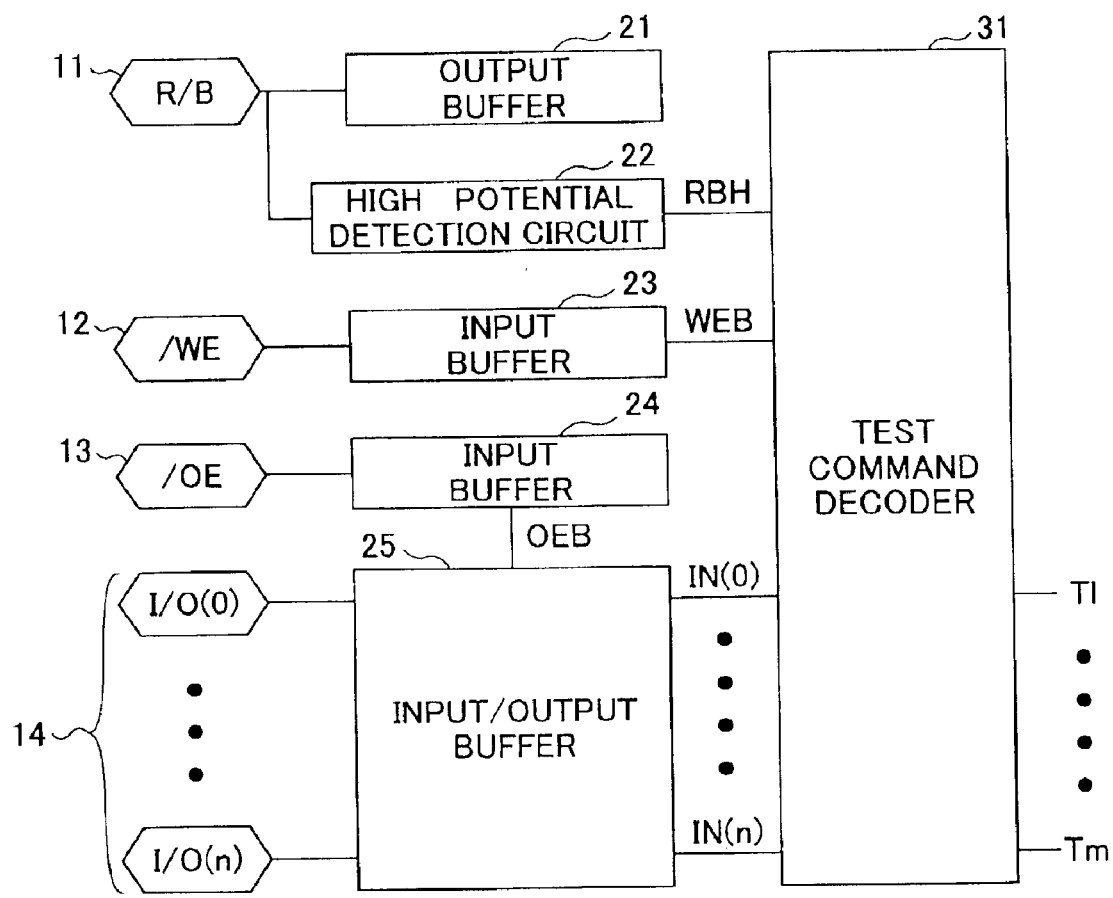
FIG. 1 is a block diagram of a related-art control circuitry for controlling test modes.
Figure 2:
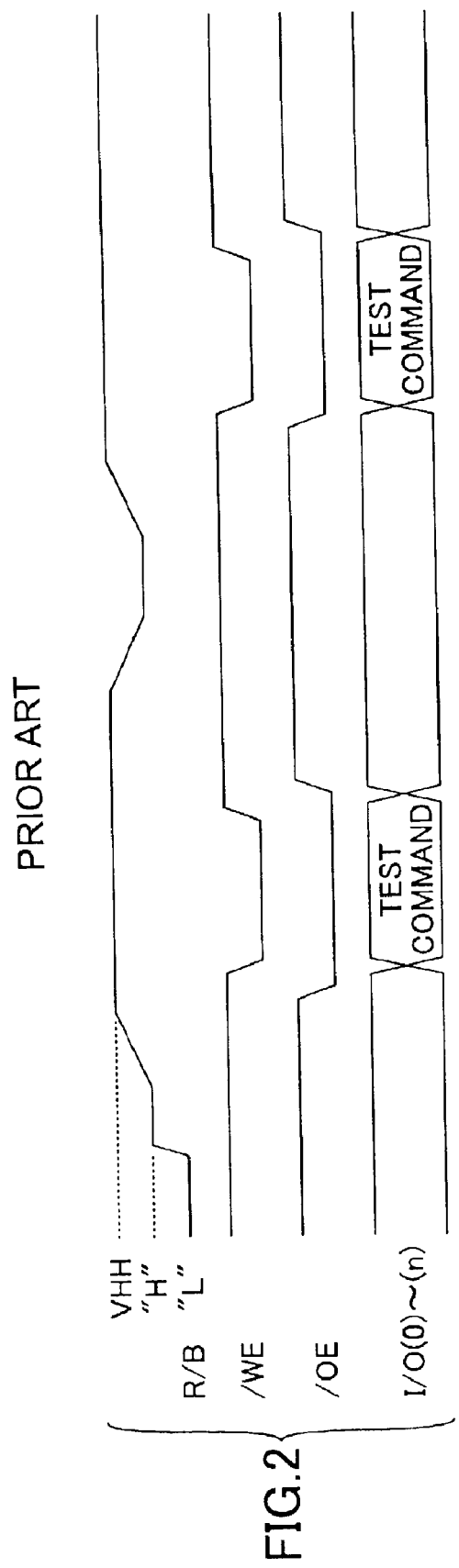
FIG. 2 is a timing chart showing the timing at which a high potential is applied and a test mode is set in the configuration of FIG. 1.
Figure 3:
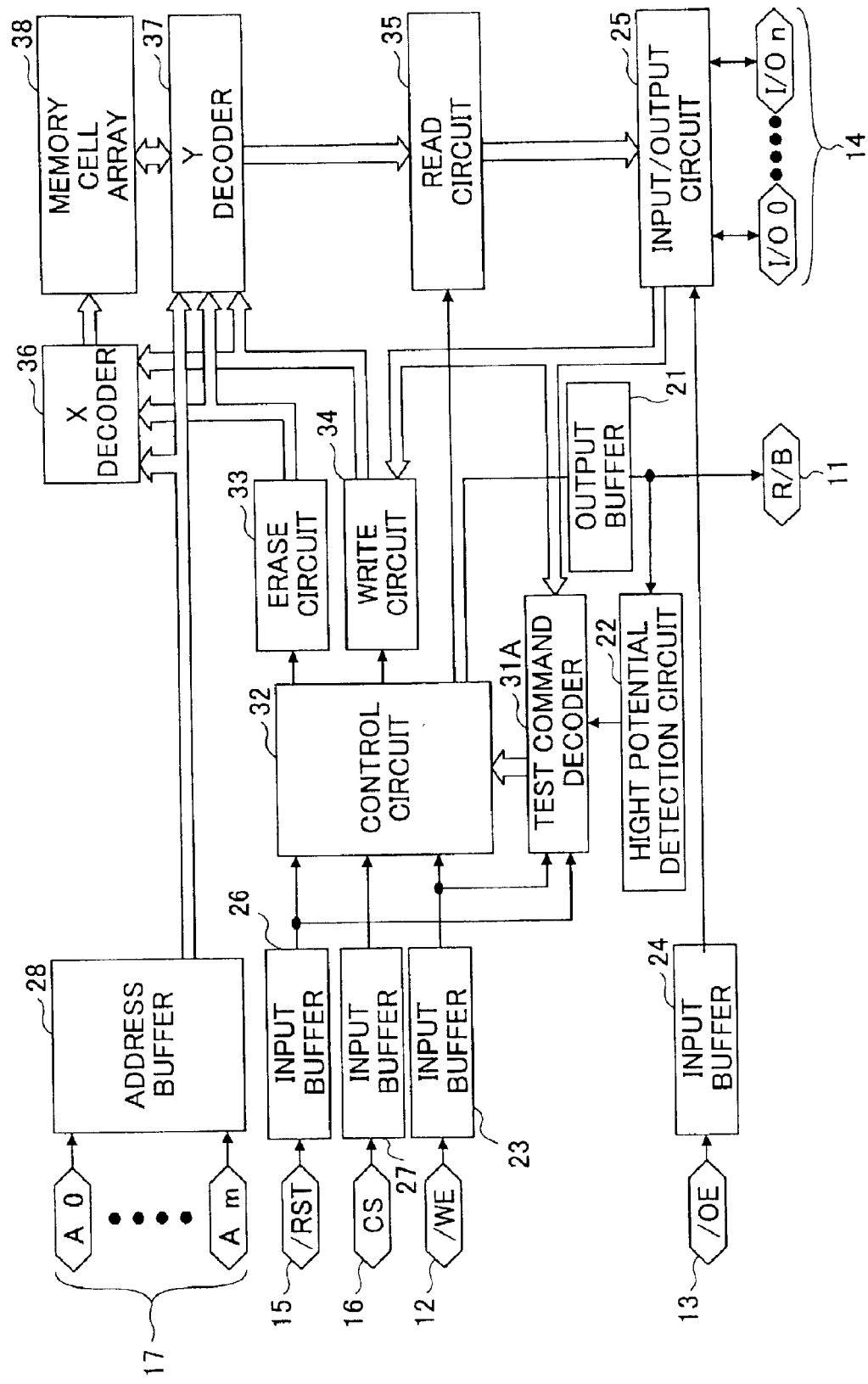
FIG. 3 is a block diagram of a semiconductor device according to the present invention.

FIG. 3 is a block diagram of a semiconductor device according to the present invention. FIG. 3 shows a nonvolatile semiconductor memory device as an example of a semiconductor device. However, the present invention is applicable to semiconductor devices in general as long as they require a test operation and the setting of a test mode, and is not limited to application to a nonvolatile semiconductor memory device.

The nonvolatile semiconductor memory device of FIG. 3 includes a R/B (ready/busy) terminal 11, a /WE (write-enable) terminal 12, an /OE (output-enable) terminal 13, I/O (input/output) terminals 14, a /RST (reset) terminal 15, a CS (chip-enable) terminal 16, address terminals 17, an output buffer 21, a high potential detection circuit 22, an input buffer 23, an input buffer 24, an input/output circuit 25, an input buffer 26, an input buffer 27, an address buffer 28, a test command decoder 31A, a control circuit 32, an erase circuit 33, a write circuit 34, a read circuit 35, an X decoder 36, a Y decoder 37, and a memory cell array 38.

In the read operation, a /RST terminal 15, a CS terminal 16, and a /WE terminal 12 are set to HIGH, HIGH, and HIGH, respectively. In response, the control circuit 32 controls the read circuit 35 and so on, thereby performing a read operation. At this time, the /OE terminal 13 is set to LOW.

Address signals supplied from an exterior to the address terminals 17 are provided to the X decoder 36 and the Y decoder 37 via the address buffer 28. The X decoder 36 decodes the address signals supplied thereto, resulting in data of a specified X address being read from the memory cell array 38. The Y decoder 37 decodes the address signals supplied thereto, and selects data of a memory cell corresponding to a specified Y address among the retrieved data of the specified X address, followed by supplying the selected data to the read circuit 35. The read circuit 35 compares the read data with data of a reference memory cell, so as to determined whether the read data is 0 or 1. The determination made is output to an exterior from the I/O terminals 14 via the input/output circuit 25.

In the write operation, the /RST terminal 15 and the CS terminal 16 are both set to HIGH. With this setting being intact, a LOW pulse is supplied to the /WE terminal 12, and, at the same time, a write command is supplied to the I/O terminals 14. In response, the write circuit 34 and relating circuits operate under the control of the control circuit 32 to perform a write operation. At this time, the /OE terminal 13 is set to HIGH.

Address signals supplied from an exterior to the address terminals 17 are provided to the X decoder 36 and the Y decoder 37 via the address buffer 28. The X decoder 36 and the Y decoder 37 decode the address signals supplied thereto, thereby selecting a memory cell of a specified X address and a specified Y address in the memory cell array 38. The control circuit 32 controls the write circuit 34 to generate a bias that is necessary for the write operation. This bias is applied to the selected memory cell via the X decoder 36 and the Y decoder 37, so that the write operation with respect to the selected memory cell is carried out. During the write operation, the R/B terminal 11 outputs a LOW level, indicating that the chip is in the operating state.

In the erase operation, both the /RST terminal 15 and the CS terminal 16 are set to HIGH. With this setting being intact, a LOW pulse is applied to the /WE terminal 12, and, at the same time, an erase command is supplied to the I/O terminals 14. In response, the erase circuit 33 and relating circuits operate under the control of the control circuit 32 to perform an erase operation. At this time, the /OE terminal 13 is set to HIGH.

Address signals supplied from an exterior to the address terminals 17 are provided to the X decoder 36 and the Y decoder 37 via the address buffer 28. The X decoder 36 and the Y decoder 37 decode the address signals supplied thereto, thereby selecting a memory cell that is to be erased in the memory cell array 38. The control circuit 32 controls the erase circuit 33 to generate a bias that is necessary for the erase operation. This bias is applied to the selected memory cell via the X decoder 36 and the Y decoder 37, so that the erase operation with respect to the selected memory cell is carried out. During the erase operation, the R/B terminal 11 outputs a LOW level, indicating that the chip is in the operating state.

If it is desired to suspend the write or erase operation in the middle of operation, a LOW level is applied to the /RST terminal 15. In response to the LOW input, the control circuit 32 suspends the operation of the erase circuit 33 or the write circuit 34.

The nonvolatile semiconductor memory device of FIG. 3 is provided with the test command decoder 31A, which decodes a command input into the I/O terminals 14 so as to set the nonvolatile semiconductor memory device to a desired test mode. According to the test mode specified by the test command decoder 31A, the control circuit 32 carries out a corresponding test operation.

Figure 4:
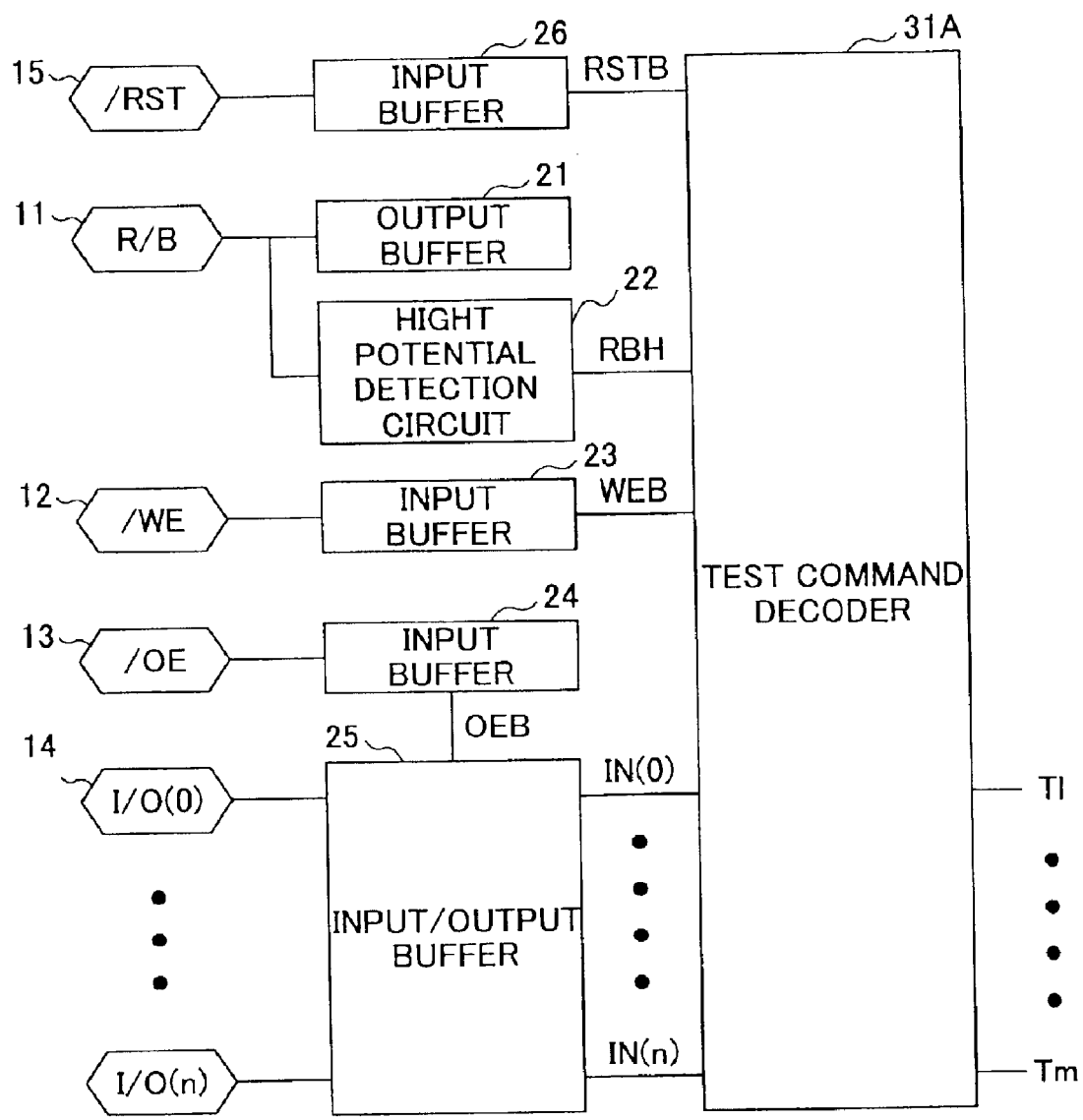
FIG. 4 is a block diagram showing a surrounding configuration around a test command decoder.

FIG. 4 is a block diagram showing a surrounding configuration around the test command decoder 31A.

The I/O terminals 14 are coupled to the input/output circuit 25. The output signals IN(0)–IN(n) are supplied to the test command decoder 31A. Status settings of the I/O terminals 14 are controlled by the /OE terminal 13 that is used to indicate an output-enable state. In detail, the /OE terminal 13 is set to LOW if the I/O terminals 14 are to be placed in the signal-inputting state.

The /WE terminal 12 is a control pin that controls a command input. A command specified at the I/O terminals 14 is received during the period of /WE being LOW, and is latched at the time /WE changes to HIGH. The /WE terminal 12 is connected to the input buffer 23, which produces an output signal WEB, which is supplied to the test command decoder 31A.

The R/B terminal 11 that outputs a ready/busy signal is connected to the high potential detection circuit 22 in addition to the output buffer 21. When a high potential VHH is applied to the R/B terminal 11, the high potential detection circuit 22 produces an output signal RBH that is HIGH. This output signal RBH is supplied to the test command decoder 31A.

The /RST terminal 15 is a pin that receives a reset signal, and is connected to the input buffer 26. A signal RSTB output from the input buffer 26 is supplied to the test command decoder 31A.

As described above, the test command decoder 31A receives the signals RSTB, RBH, WEB, and IN(0)–IN(n). The signal RBH sets a latch circuit in a latch-ready condition where the latch circuit is provided in the test command decoder 31A. The signals IN(0)–IN(n) are stored in the latch circuit, and indicate a test mode through a particular combination thereof. The signal WEB opens a signal path through which the signals IN(0)–IN(n) are supplied to the latch circuit. Further, the signal RSTB serves to reset the latch circuit of the test command decoder 31A.

Figure 5:
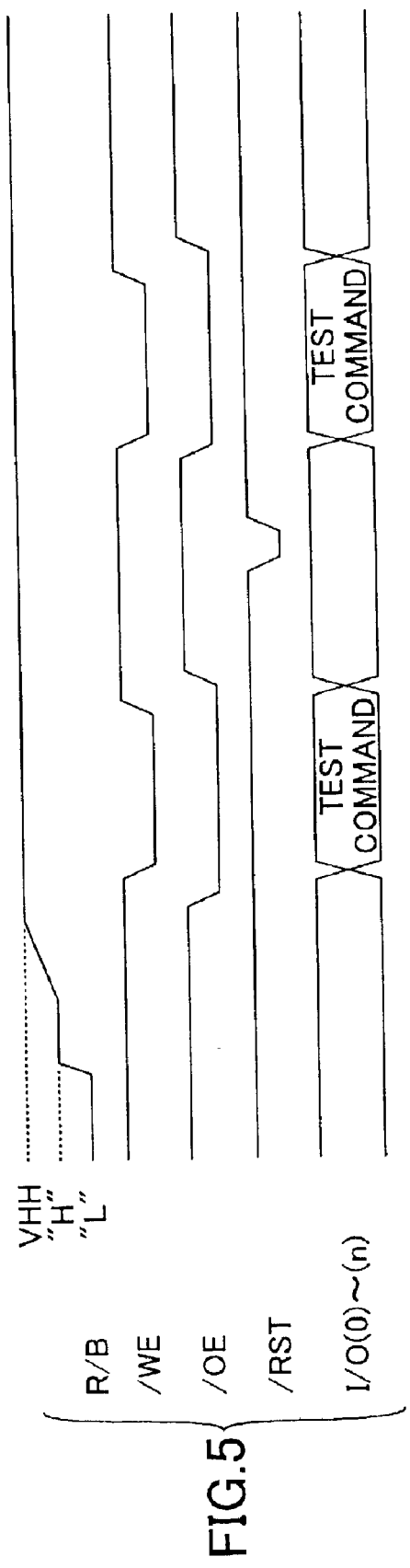
FIG. 5 is a timing chart showing the timing at which a high potential is applied and a test mode is set in the configuration of FIG. 4.
Figure 6:
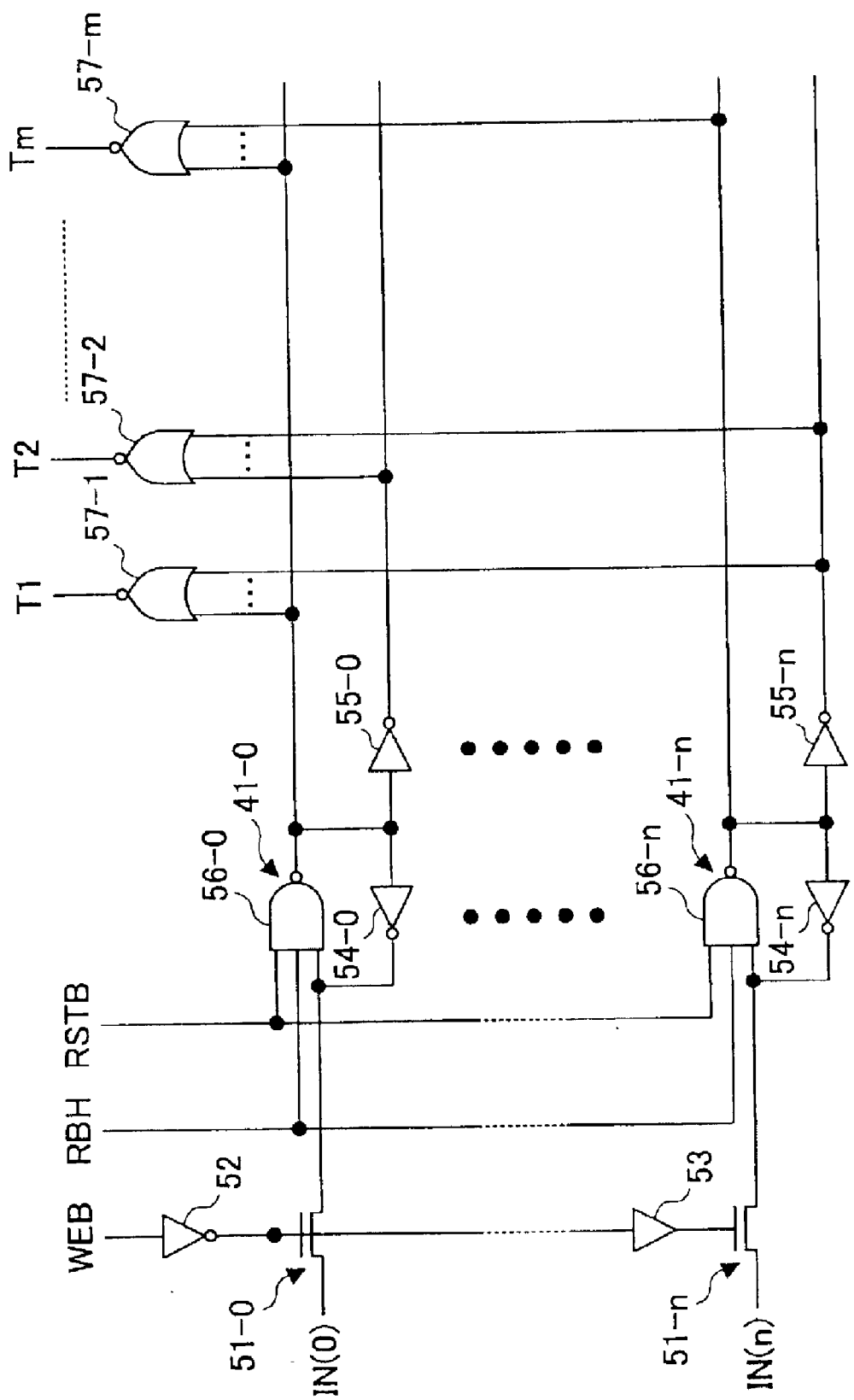
FIG. 6 is a circuit diagram showing a circuit configuration of the test command decoder.

FIG. 5 is a timing chart showing the timing at which a high potential is applied and a test mode is set. FIG. 6 is a circuit diagram showing a circuit configuration of the test command decoder 31A.

The test command decoder 31A includes NMOS transistors 51-0 through 51-n, an inverter 52, a buffer 53, inverters 54-0 through 54-n, inverters 55-0 through 55-n, NAND circuits 56-0 through 56-n, and NOR circuits 57-1 through 57-m. The NAND circuit 56-i and the inverter 54-i (i=1, 2, ..., n) together form a latch circuit 41-i (i=1, 2, ..., n) by receiving the output of the other as an input each other.

With the signal RSTB being HIGH in response to HIGH at the /RST terminal 15, the high potential VHH is applied to the R/B terminal 11 to change the signal RBH to HIGH. In response, the NAND circuit 56-i operates as an inverter with respect to the input signal IN(i), so that the latch circuit 41-i is placed in a latch-ready condition. The /OE terminal 13 is then turned to LOW, and command signals are supplied to the I/O terminals 14, with LOW being applied to the /WE terminal 12. In response, the NMOS transistor 51-i situated at the input of the latch circuit 41-i becomes conductive, so that the data at the I/O terminal 14 is latched by the latch circuit 41-i.

The /WE terminal 12 is thereafter returned to HIGH. The NMOS transistor 51-i becomes nonconductive in response, but the latched data remains to be held by the latch circuit 41-i. Outputs of the latch circuits 41-0 through 41-n are decoded by the NOR circuits 57-1 through 57-m, which output decoded signals T1 through Tm indicative of a selected test mode. The decoded signals T1 through Tm are supplied to the control circuit 32 shown in FIG. 3.

The combination of the latched signals IN(0)–IN(n) in the latch circuit determines a test mode that is selected from a plurality of test modes. If five input/output terminals are used, for example, 32 different combinations can be specified in principle. Since the particular combination of the signals I/O(0)–I/0(4) that is comprised of all LOW inputs generates latch outputs that are the same as those of a normal and routine mode other than a test mode, the 31 remaining combinations are used to represent test modes.

In the present invention, the signal RSTB associated with the /RST terminal 15 is supplied to the test command decoder 31A. The /RST terminal 15 is set to LOW during a test mode, thereby resetting the test mode. The /RST terminal 15 is normally kept at the HIGH level, but is changed to LOW when there is a need to reset the test mode in the middle of the test mode. In response, the RSTB signal changes to LOW, which forces the output of the NAND circuit 56-i to be HIGH in the latch circuit 41-i. As a result, the latch is reset. Since all the latch circuits are reset to LOW, no test mode is now selected, thereby the current test mode being reset. The /RST terminal 15 is thereafter returned to HIGH, followed by a test command being entered into the I/O terminals 14, which initiates a change to a next test mode.

As shown in FIG. 5, the /RST terminal 15 to which the high potential VHH is applied is kept at the high potential level during the switching of test modes as described above.

In the present invention as described above, test modes can be switched without changing the high potential that is applied to a predetermined terminal of the semiconductor device during a test mode. This makes the time required for switching of test modes shorter.

When data is written in the nonvolatile semiconductor memory device during a test mode, for example, the device is set to the write mode to apply the write bias to memory cells, and, then, is set to the write verify mode in order to check whether the writing of data is sufficiently done. If the verify operation finds that the writing of data is insufficient, the write mode is again engaged to write data, which is followed by another write verify mode for performing a verify operation. Such write operation and write verify operation are repeated until sufficient data writing is achieved. If the entire memory cell array needs to be written, this operation needs to be repeated a large number of times. The same argument applies in the case of erase operations. In the semiconductor memory device of the present invention, the time required for switching of modes is shortened compared with the time required in the related-art semiconductor memory devices, thereby significantly reducing the test time.

Figure 7:
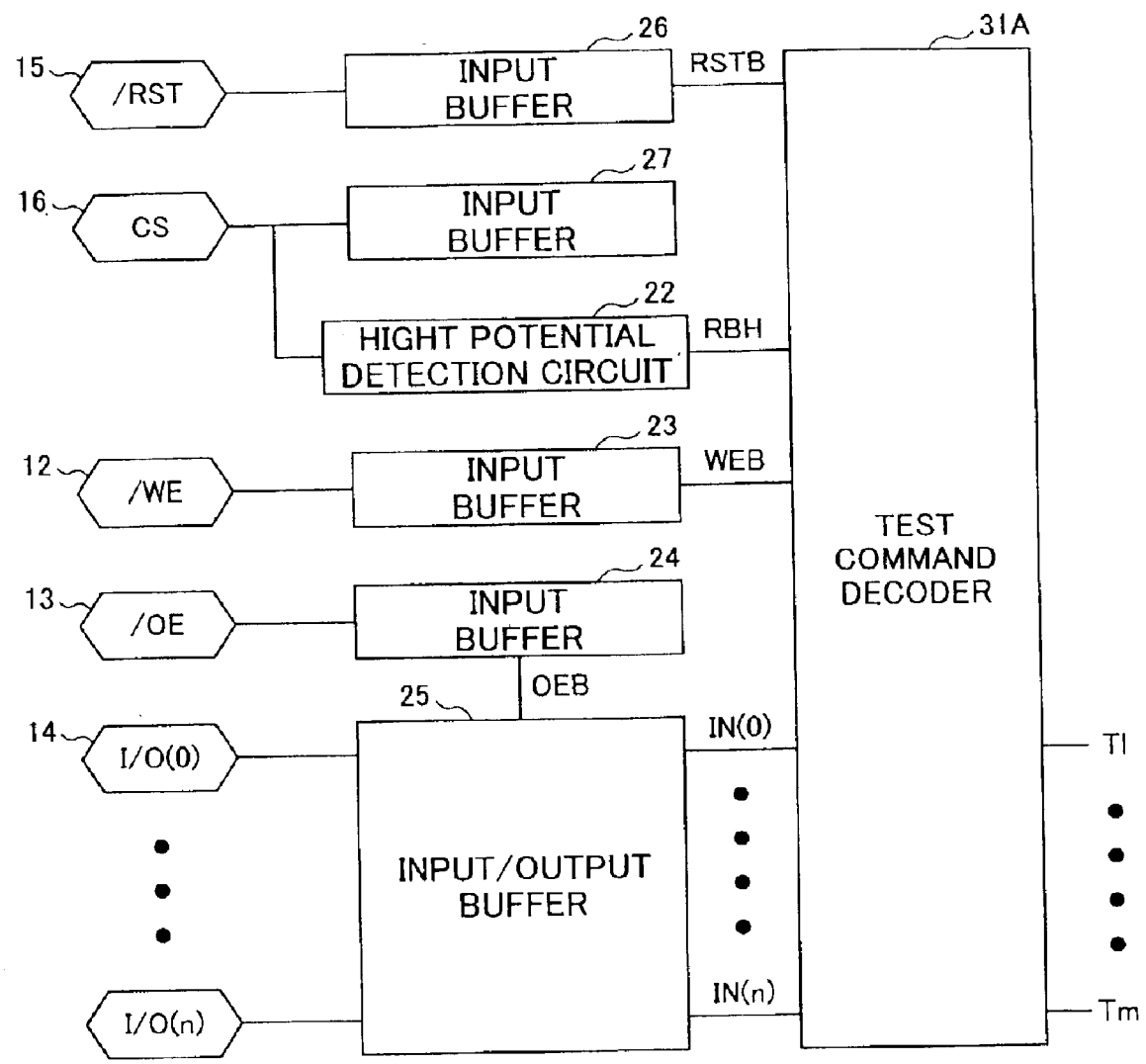
FIG. 7 is a block diagram showing a variation of a surrounding configuration around the test command decoder.

The above embodiment is but an example provided for the purpose of explaining the present invention, and is not intended to be limiting in any sense. For example, although the R/B terminal was used as a terminal to receive a high potential, a CS terminal can be alternatively used for the same purpose as shown in FIG. 7. The /RST terminal for reset instruction and the /WE terminal for write instruction used in the above embodiment do not have to be the terminals as described, but can be any terminal pins as long as they are not already assigned in the test mode.

Further, the present invention is not limited to these embodiments, but various variations and modifications may be made without departing from the scope of the present invention.

The present application is based on Japanese priority application No. 2001-320908 filed on Oct. 18, 2001, with the Japanese Patent Office, the entire contents of which are hereby incorporated by reference.

What is claimed is:

1. A semiconductor device, comprising:

a first terminal;

a high potential detection circuit coupled to said first terminal to generate a high potential detection signal in response to a high potential above a predetermined potential range applied to said first terminal;

a second terminal;

a third terminal; and a latch circuit coupled to said second terminal and said third terminal and configured to latch a command signal supplied to the second terminal in response to the high potential detection signal and to be reset;

in response to a signal within the predetermined potential range supplied to said third terminal from an exterior of the device, wherein said semiconductor device operates in a first operation mode when a signal within the predetermined potential range is applied to said first terminal, and operates in a second operation mode in response to the command signal latched by the latch circuit.

2. The semiconductor device as claimed in claim 1, wherein said first operation mode is a normal operation mode, and said second operation mode is a test operation mode.

3. The semiconductor device as claimed in claim 2, further comprising a control circuit which performs a test of internal circuitry in response to the command signal latched by the latch circuit.

4. The semiconductor device as claimed in claim 3, further comprising memory cells that are tested by said control circuit.

5. The semiconductor device as claimed in claim 3, wherein said control circuit switches from the second operation mode to the first operation mode in response to the resetting of said latch circuit.

6. The semiconductor device as claimed in claim 1, wherein the predetermined potential range ranges from a ground potential to a power supply potential.

7. The semiconductor devices as claimed in claim 1, wherein said latch circuit comprises:

a NAND circuit having three inputs;

an inverter which receives as an input thereof an output of said NAND circuit, and supplies an output thereof to said NAND circuit as one of the three inputs of said NAND circuit, wherein said one of the three inputs of said NAND circuit receives the command signal from said second terminal, and the two remaining inputs of said NAND circuit receive the high potential detection signal and the signal that is supplied to said third terminal, respectively.

8. The semiconductor device as claimed in claim 1, wherein said second terminal includes a plurality of data input/output terminals.

* * * * *